United States Patent [19]

Hirano et al.

[11] Patent Number: 4,924,391
[45] Date of Patent: May 8, 1990

[54] TROUBLE-DIAGNOSABLE MULTIFUNCTION TESTING APPARATUS

[75] Inventors: Shigeaki Hirano; Hirotoshi Maekawa, both of Himeji; Tsutomu Kubozono; Minoru Tatemoto, both of Tokyo, all of Japan

[73] Assignee: Mitsubishi Denki Kabushiki Kaisha, Tokyo, Japan

[21] Appl. No.: 160,837

[22] Filed: Feb. 26, 1988

[30] Foreign Application Priority Data

| Feb. 27, 1987 | [JP] | Japan | 62-28231[U] |
|---|---|---|---|
| Feb. 27, 1987 | [JP] | Japan | 62-28232[U] |
| Feb. 27, 1987 | [JP] | Japan | 62-28233[U] |
| Feb. 27, 1987 | [JP] | Japan | 62-28234[U] |
| Feb. 27, 1987 | [JP] | Japan | 62-28235[U] |
| Feb. 27, 1987 | [JP] | Japan | 62-28236[U] |
| Feb. 27, 1987 | [JP] | Japan | 62-28237[U] |
| Feb. 27, 1987 | [JP] | Japan | 62-28238[U] |
| Feb. 27, 1987 | [JP] | Japan | 62-28239[U] |
| Mar. 31, 1987 | [JP] | Japan | 62-78715[U] |
| Mar. 31, 1987 | [JP] | Japan | 62-47758[U] |
| Mar. 31, 1987 | [JP] | Japan | 62-47759[U] |

[51] Int. Cl.$^5$ .......................................... G06F 15/74
[52] U.S. Cl. ............................. 364/424.03; 364/551.01; 73/117.3
[58] Field of Search ............... 364/551.01, 431.01, 364/431.04, 431.11, 424.03; 73/116, 117.2, 117.3

[56] References Cited

U.S. PATENT DOCUMENTS

| 4,125,894 | 11/1978 | Cashel et al. | 364/442 |
|---|---|---|---|
| 4,337,515 | 6/1982 | Kreft | 364/551 |
| 4,476,531 | 10/1984 | Marino et al. | 364/431.01 |
| 4,497,057 | 1/1985 | Kato et al. | 371/29 |
| 4,602,127 | 7/1986 | Neely et al. | 364/431.03 |
| 4,694,408 | 9/1987 | Zaleski | 364/551.01 |
| 4,748,566 | 5/1988 | Sasaki et al. | 364/551.01 |
| 4,757,463 | 7/1988 | Ballou et al. | 364/551 |
| 4,796,206 | 1/1989 | Boscove et al. | 364/551.01 |

FOREIGN PATENT DOCUMENTS

| 3121645 | 12/1982 | Fed. Rep. of Germany. |
|---|---|---|
| 3332037 | 3/1985 | Fed. Rep. of Germany. |
| 3432430 | 3/1986 | Fed. Rep. of Germany. |
| 3727549 | 2/1988 | Fed. Rep. of Germany. |
| 3727551 | 3/1988 | Fed. Rep. of Germany. |
| 2918956 | 8/1988 | Fed. Rep. of Germany. |

OTHER PUBLICATIONS

DE-Z.: Siemens Review, Jan. 1974, No. 1, pp. 14–19, "Electronic Diagnostic Testing of Vehicles for Volkswagen".

Japanese Patent Publication No. 32173/1986 (corresponds to above-noted U.S. Application).

*Primary Examiner*—Thomas G. Black
*Attorney, Agent, or Firm*—Wolf, Greenfield & Sacks

[57] ABSTRACT

A trouble-diagnosable multifunction testing apparatus is disclosed for use with a first half part of a collective connector provided in an automotive vehicle, the first half part of the collective connector including a plurality of signal lines connected respectively to a plurality of electronic control units disposed in the vehicle for transmitting a trouble-diagnosis output signal or various data signals obtained from each of the plurality of electronic control units, and a common switchable signal line connected with each of the plurality of electronic control units for transmitting an electric signal having a first or second logic level, the first half part of the collective connector being connected operatively with both of the signal lines, respectively. When a conventional test unit is connected to the first half connector part, the electronic control units transmit data signals to it at a first rate. When a special high-speed test unit is connected to the first half connector part, it places a signal on the common switchable signal line which signal causes the electronic control units to transmit data at a rate which is higher than the first rate.

15 Claims, 21 Drawing Sheets

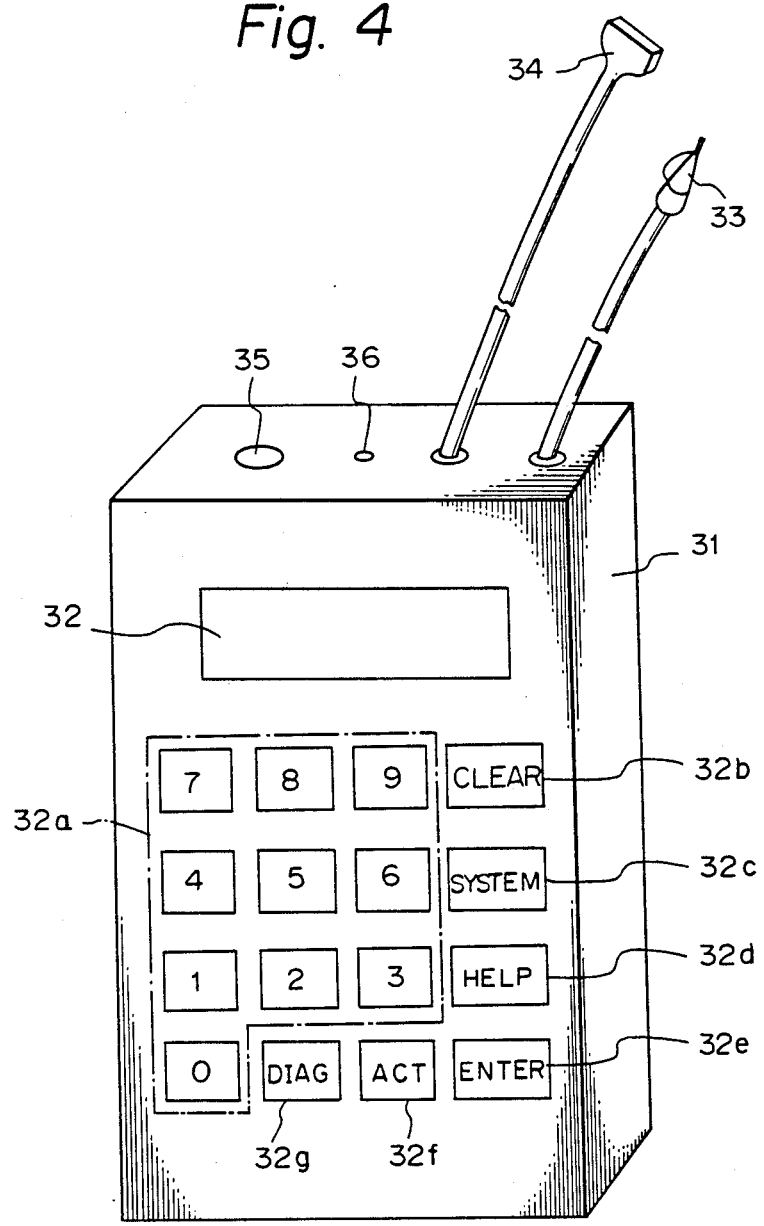

|  | 43a | 37a |
|---|---|---|
| 400011 | 5 | 5 |
| 400111 | A | A |
| 400211 | 6 | 6 |
| 400311 | 9 | 9 |
| ⋮ | ⋮ | ⋮ |

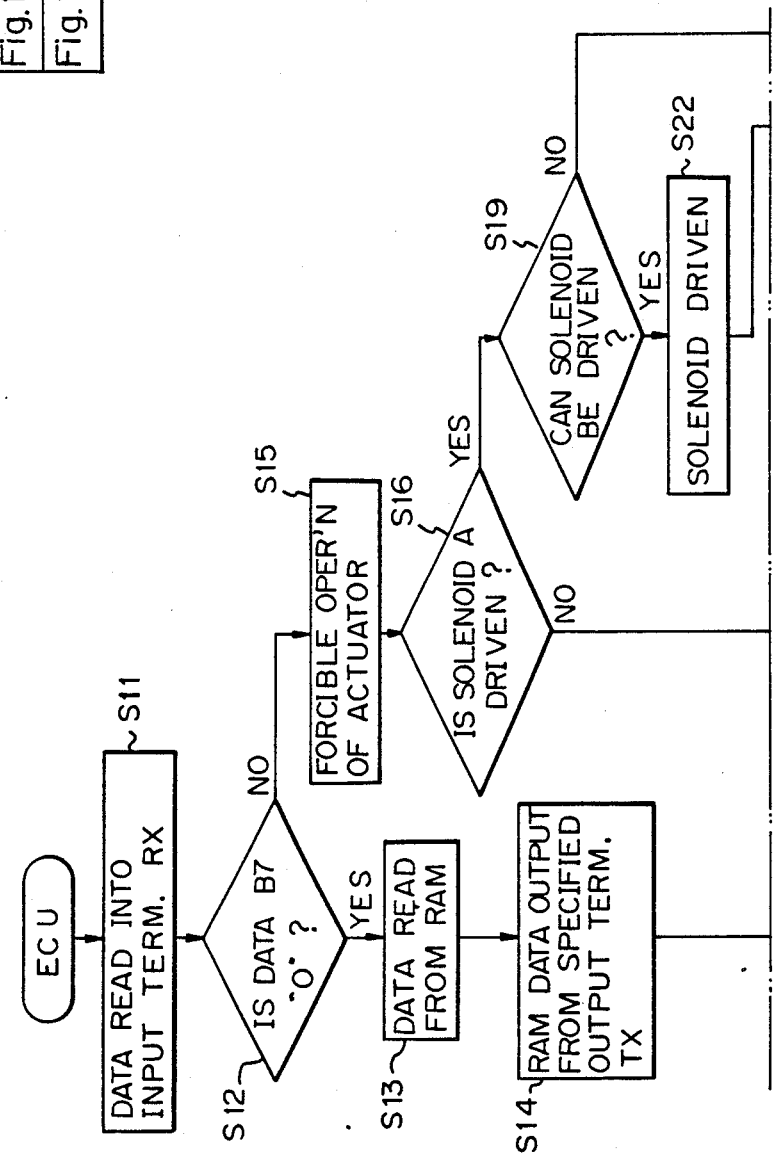

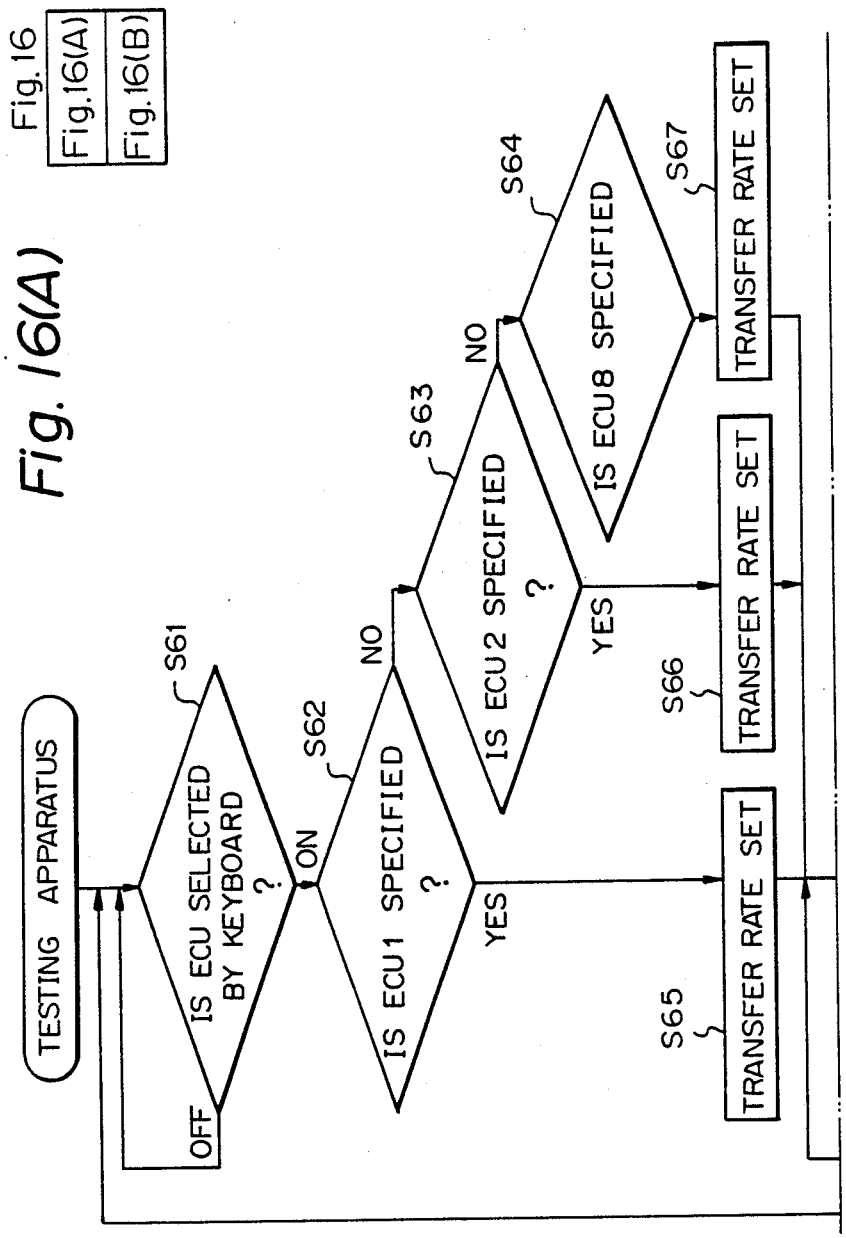

CORRESP. TO MODEL'S CODES

TROUBLE-DIAGNOSABLE MULTIFUNCTION TESTING APPARATUS

BACKGROUND OF THE INVENTION

1. Field of the Industrial Applicability

The present invention relates in general to a trouble-diagnosable multifunction tester for use with a variety of electronic control units for installation in automotive vehicles, and more particularly to a trouble-diagnosable multifunction testing apparatus which is specifically adapted to display trouble-diagnosis output signals (diagnosis signals) received from such electronic control units in a vehicle, and/or to transmit a series of electric test signals to these electronic control units.

2. Description of the Prior Art

Recently, with the electronification of vehicles having reached a remarkable level in the automobile industry, a variety of electronic control units (ECU's) have been employed to handle many operative functions of a vehicle. Typical examples of such ECU's, include ones for the electronic control of suspension systems, four-speed automatic transmission (4 A/T), automatic cruising systems, electronically controlled fuel injection, and so forth. From each of these ECU's extends a single signal line or electric lead on which an electric error code or electric diagnosis signal (trouble-diagnosis output signal) is led from the ECU to be processed for further evaluation. As shown in FIG. 1, when n units of such electronic control units ECU1 through ECUn are provided, the trouble-diagnosis signals output from these units ECU1 through ECUn are collectively fed to a collective lead connector 12 for the signal lines which is, for example, provided in a fuse box 11 (see FIG. 2). This collective connector 12 is to be connected operatively by a complementary or counterpart connector from a diagnosis tester (not shown) so as that light emitting diodes 21 provided on the diagnosis tester emit light when the trouble-diagnosis signals are output from the ECU's on the vehicle [see FIG. 3(A)].

As shown, for instance, in FIG. 3(A), when a diagnosis code signal 22 is output from the signal line d of one of the ECU's, as shown in FIG. 3(B), a light emitting diode 21 is now caused to emit light repeatedly at such time intervals as 1.5 sec., 0.5 sec., 1.5 sec., 0.5 sec., etc. Then, upon receipt of this specific series of interruptions in the emission of light from the light emitting diode 21, it is possible to identify from which ECU this specific diagnosis code is being emitting to allow further diagnostic processing. In this manner, as it is essential to have the light emitting diode 21 actuated in accordance with a diagnosis code, such diagnosis code is set to be a relatively low velocity signal with a relatively wide pulse width.

Due to the fact that the conventional diagnosis codes are, as noted above, of a series of data which is unidirectionally fed from some of the ECU's installed in the vehicle to the tester and are inevitably transmitted at a relatively low velocity, it is not possible in practice for the tester to process them at a high enough processing rate. In addition, it is not practicable to have the diagnosis tester display such data which have been processed in the ECU's so that it may obtain enough data to diagnose the vehicle's operating conditions.

SUMMARY OF THE INVENTION

It is an object of the present invention to provide a trouble-diagnosable multifunction testing apparatus which can process a series of diagnosis codes at a high velocity and which can transmit electric test signals to a plurality of electronic control units installed in an automotive vehicle for the purpose of testing the current operating state of such control units.

It is another object of the invention to provide a trouble-diagnosable multifunction testing apparatus which can with a single unit perform various functions such as reading of trouble-diagnosis output signals from each of a plurality of electronic control units in an automotive vehicle and data delivered from a plurality of RAM's incorporated therein, conversion of such output signals and data into corresponding physical quantities and driving of physical actuators provided in the vehicle.

It is a further object of the invention to provide a trouble-diagnosable multifunction testing apparatus provided with a switching terminal which is switchable between a serial connection and a diagnosis position enabling it to be connected to a diagnosis connector provided in a vehicle, by means of which ECU's may detect that the testing apparatus is connected operatively to the diagnosis connector as soon as the connection is made.

It is still another object of the invention to provide a trouble-diagnosable multifunction testing apparatus provided with a switching terminal which is switchable between a serial connection and a diagnosis position enabling it to be connected to a diagnosis connector in a vehicle, by means of which ECU's may instantly detect the connection of the testing apparatus, which is then ready to relay serial output signals at a high rate of transmission, and which may allow a single signal line to be shared for the transmission of a diagnosis signal and a serial signal, thereby contributing to a reduction in the number of signal lines involved.

It is still a further object of the invention to provide a trouble-diagnosable multifunction testing apparatus which can be adapted to specify the selective driving of a specific actuator or the reading of a specific RAM's data belonging to a specific ECU in a vehicle by way of a particular bit in a series of operation codes to be output from the testing apparatus to the specific one of the ECU's, thereby enabling a multiplicity of demands to be made from the testing apparatus directed to a specific one of a plurality of ECU's.

It is another object of the invention to provide a trouble-diagnosable multifunction testing apparatus which can be adapted to selectively specify an actuator to be driven, which is connected to a specific one of a plurality of ECU's so that it can perform a simulation of the operational function, thereby allowing, for instance, the current throttle valve opening of an engine to be controlled without any need for the driven to press the accelerator pedal of the vehicle.

It is another object of the invention to provide a trouble-diagnosable multifunction testing apparatus which can be adapted to set at an appropriate level a data transmission rate for a specific ECU selected from a plurality of ECU's for testing by the test apparatus so that data transmission between the testing apparatus and the specific ECU can be made smoothly.

It is another object of the invention to provide a trouble-diagnosable multifunction testing apparatus which can be adapted to check whether the data from a given RAM of a specific ECU selected specifically for specific data by the testing apparatus is the right data, thereby making it feasible in practice to prevent any possible erroneous communication with a system other than the relevant ECU and system so specified.

It is another object of the invention to provide a trouble-diagnosable multifunction testing apparatus which comprises a means to allow specifying a clearing of the diagnosis data stored in the memory of a specific ECU, thereby enabling the clearing of that diagnosis data alone, with other necessary data such as data of learning, etc. stored in the memory of that specific ECU left uncleared.

It is another object of the invention to provide a trouble-diagnosable multifunction testing apparatus which comprises a means to concurrently display several data from a plurality of RAM's in a specific ECU, when data from the plurality of RAM's are required by the testing apparatus, thereby making it possible to review the current relationship of data from those RAM's visually.

It is another object of the invention to provide a trouble-diagnosable multifunction testing apparatus which can be adapted to use a specific collection of data which is particularly to a specific ECU such as an area allocation for a RAM's data, a constant of data correction, etc. by way of an ROM pack which can be installed interchangeably, thereby enabling by the selection of a given ROM due correspondence with any changes in data which are adapted to an individual ECU in accordance with an individual car manufacturer and model codes thereof.

It is another object of the invention to provide a trouble-diagnosable multifunction testing apparatus which is provided with a useful function of trouble-checking for loose fitting of a removably set ROM pack, thereby preventing any erroneous handling and hence useless operations that could possibly be made if the loose fitting condition of a ROM were not revealed.

It is another object of the invention to provide a trouble-diagnosably multifunction testing apparatus which comprises a means to produce a warning sound when any changes are observed in the level of pulse signals from an ECU installed in a vehicle for the purpose of watching, for instance, a desired state of a locked door of the vehicle, whereby the operator can be assumed that the door is locked properly.

Summarized in brief, are object of the present invention is essentially directed to the provision of a trouble-diagnosable multifunction testing apparatus for use with a first half of a collective connector provided in an automotive vehicle, the first half of the collective connector including a plurality of signal lines connected respectively to a plurality of electronic control units disposed in the automotive vehicle for transmitting a trouble-diagnosis output signal or various data signals obtained from each of the plurality of electronic control units, and a common switchable signal line connected to each of the plurality of electronic control units for transmitting an electric signal having a first or second logical level, the first half of the collective connector being connected operatively to both of the signal lines, the apparatus comprising, in combination, a second half of the collective connector being connectable complementarily to the first half of the collective connector; a selector circuit means adapted to select one of the plurality of signal lines to be connected thereto; a transmitting/receiving circuit means adapted to transfer said trouble-diagnosis output signals or the various data signals by way of each of the plurality of signal lines; a control means adapted to control the transfer of the signals from the transmitting/receiving circuit means; a switching means adapted to switch the signal having the first logical level to the one with the second logical level on the switchable signal line; and a signal conversion circuit means adapted to perform a serial/diagnosis conversion of a signal fed through any one of the plurality of signal lines in response to the receipt of the signals having the first or second logical level switched by the switching means; and wherein the signal having the second logical level is fed to each of the plurality of electronic control units through the common switchable signal line when the first half of the collective connector and the second half of the collective connector are connected together.

Again summarized in brief, another object of the present invention is essentially directed to the provision of a trouble-diagnosable multifunction testing apparatus for use with a first half of the collective connector provided in an automotive vehicle, the first half of the collective connector including a plurality of signal lines connected respectively to a plurality of electronic control units disposed in the vehicle for transmitting a trouble-diagnosis output signal or various RAM data signals obtained from each of the plurality of electronic control units, and a common switchable signal line connected to each of the plurality of electronic control units for transmitting an electric signal having a first or second logical level, the first half of the collective connector being connected operatively to both of the signal lines, the apparatus comprising, in combination, a second half of the collective connector being connectable complementarily to the first half of the collective connector; a control means adapted to execute reading of the trouble-diagnosis output signals or the various RAM data signals upon operative connection of the second half of the collective connector to the first half of the collective connector, conversion of the read RAM data into a corresponding physical quantity, and driving of actuators provided on each of the plurality of electronic control units.

Other object and advantages of the present invention will become more apparent to those skilled in the art after considering the following detailed description of preferred embodiments exemplifying the best mode of carrying out the invention as presently perceived. The detailed description refers particularly to the accompanying drawings, in which like parts are designated by like reference numerals.

BRIEF DESCRIPTION OF THE DRAWINGS

FIG. 4 is a general perspective view showing a trouble-diagnosable multifunction testing apparatus according to the present invention;

FIGS. 12(A) and 12(B) are flow charts showing the manner in which data is processed by ECU's in connection with data transmission to the testing apparatus of the invention;

FIGS. 16(A) and 16(B) are flow charts showing the manner in which data is processed in the testing apparatus for setting a data transmission rate;

DETAILED DESCRIPTION OF A PREFERRED EMBODIMENT

Figure 1:
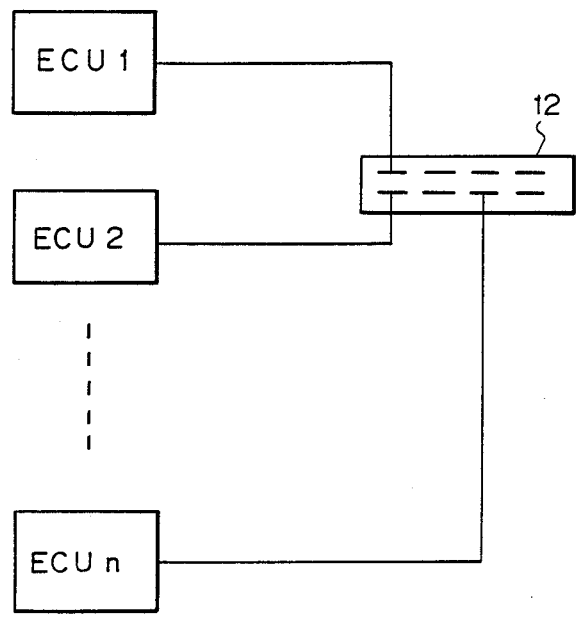
FIG. 1 is a schematic view showing an electric lead connector for the connection of a testing apparatus of the present invention for checking trouble-diagnosis signals.
Figure 2:
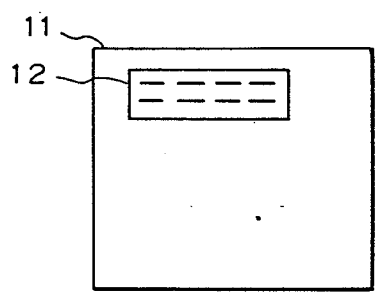
FIG. 2 is a schematic view showing the general appearance of an electric lead connector located in a fuse box of an automotive vehicle.
Figure 3A:
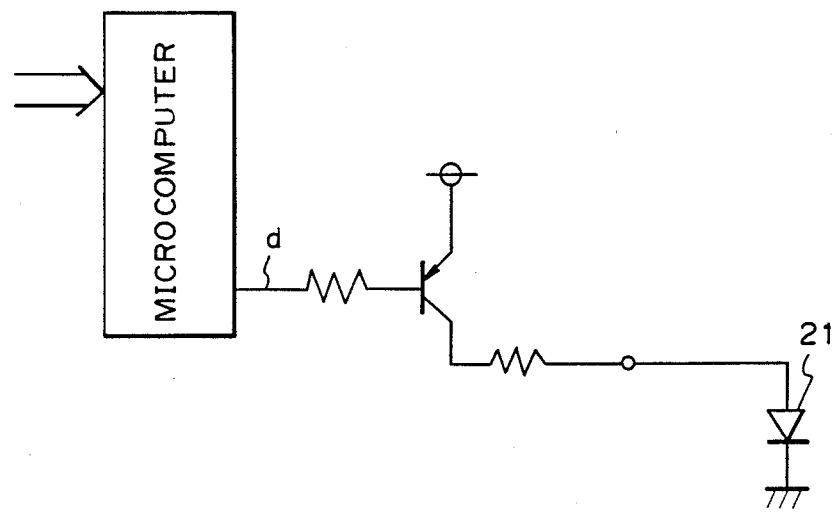
FIG. 3(A) is a fragmentary circuit diagram showing a typical conventional circuit for displaying a trouble-diagnosis signal.
Figure 3B:
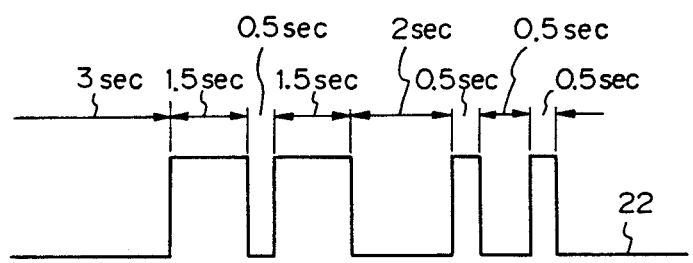
FIG. 3(B) is a graphic representation showing by way of example part of a typical pulse train of a trouble-diagnosis signal.

The present invention relating to a trouble-diagnosable multifunction testing apparatus will now be explained in more detail by referring to a preferred embodiment thereof in conjunction with the accompanying drawings. Reference is first made to FIG. 4, which is a schematic perspective view showing the general appearance of a trouble-diagnosable multifunction testing apparatus. Referring to this figure, a testing apparatus is shown that consists of a housing for the testing apparatus designated by reference numeral 31, a visual display 32 of, for example, liquid crystal type with one line of 16 digits, an electric plug 33 to be connected to the cigarette lighter power source of a vehicle, and an electric collective connector 34 of, for example, 12-pin type, which is to be connected to the couterpart collective connector provided in part of the vehicle as described later. Also shown are another electric connector 35 for extension use and a variable resistor shafting for controlling the brightness of the visual display.

Figure 5:
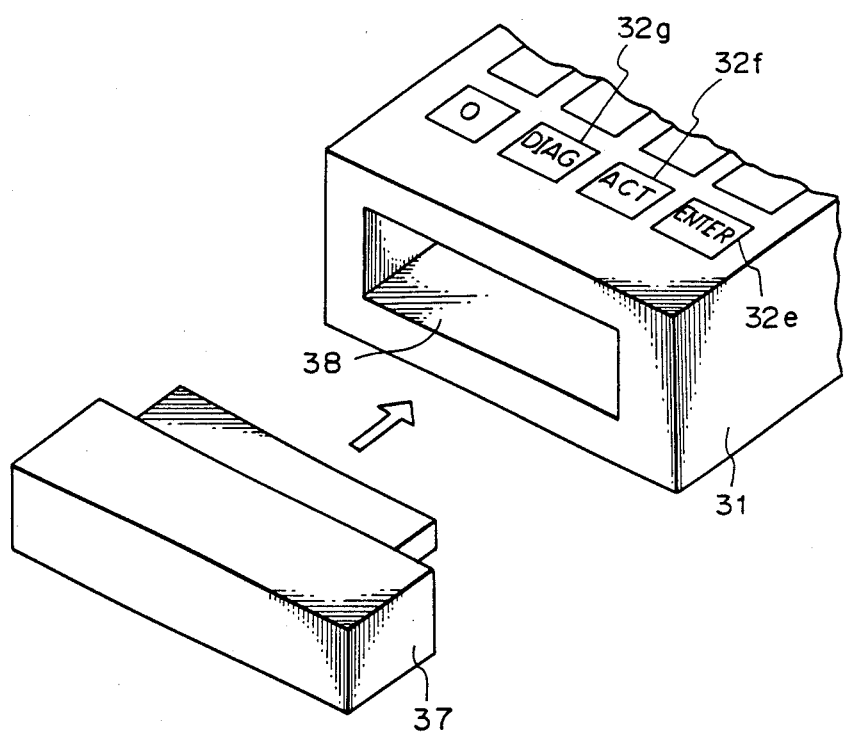
FIG. 5 is a fragmentary perspective view showing the bottom portion of the testing apparatus of the invention.

Also provided on the surface of the tester housing 31 where the visual display 32 is located are ten keys 32a, a "CLEAR" key 32b, a "SYSTEM" key 32c, a "HELP" key 32d, an "ENTER" key 32e, an "ACT" key 32f, and a "DIAG" key 32g. The "CLEAR" key 32b is operated by depressing it when it is desired to initialize the testing apparatus. The "SYSTEM" key 32c is used to select a system desired to be operated. The "HELP" key 32d is used to display a visual explanatory indication for a command on display. The "ENTER" key 32e is for reading serial data in setting each command. The "ACT" key 32f is for causing a specific actuator to be driven, and the "DIAG" key 32g is operated for the checking of trouble-diagnosis performance by the testing apparatus. At the bottom portion of the testing apparatus, is provided a recess or open space 38 for receiving removably a suitable ROM (read only memory) pack 37 as shown in FIG. 5. A specific set of data is stored in one ROM pack 37 which is particular to a corresponding ECU.

Figure 6:
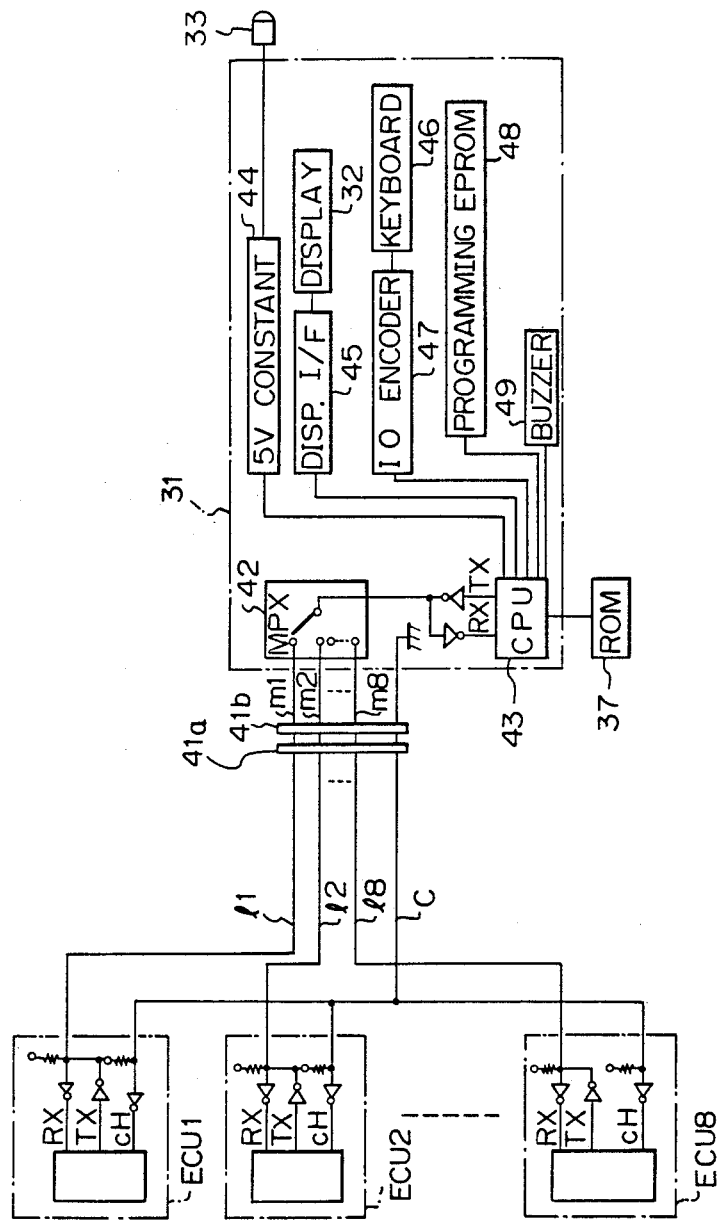
FIG. 6 is a block diagram showing generally a control circuit for the testing apparatus of the invention.

Reference is now made to FIG. 6 in order to further explain the control circuit in the testing apparatus 31. In FIG. 6 is shown by way of example an application for use with a vehicle equipped with eight (8) electronic control units (ECU1 through ECU8). In this illustrated application are employed ECU1 for the control of the vehicle's engine, ECU2 for the control of the vehicle's power steering system, ECU3 for the control of the vehicle's axle suspension system, ECU4 for the control of the vehicle's braking system, ECU5 for the vehicle's low speed range control, ECU6 for the vehicle's transmission control, ECU7 for the vehicle's air conditioner control, and ECU8 for the control of another function of the vehicle, for instance, an ETACS (electronic time and alarm control system) which represents computer-aided collective control of the timer and alarm functions of the vehicle. Each of these ECU1 through ECU8 has a data output terminal TX and a data input terminal RX, respectively, which together extend outwardly as a single signal line for connection to a first half of collective connector 41a, thus having eight signal lines respectively extending from each ECU through respective lead wires 11 through 18. Also, provided is a serial/diagnosis signal switching terminal CH in each of ECU1 through ECU8 and, as described later, the system of transmitting data from the output terminal TX is changed in accordance with the current level of a logic signal to be input to the switching terminal CH. The switching terminal CH of each one of ECU1 through ECU8 is connected to a common signal line C which is in turn connected to the first half of connector 41a, separately from the individual signal lines 11 through 18 noted above. The first half of connector 41a is designed to be connected to a counterpart or second half of connector 41b provided on part of the testing apparatus 31, and when these connectors 41a and 41b are connected together, each of the signal lines 11 through 18 is connected respectively to each of the signal leads m1 through m8, and the common signal line C is given a ground potential (logic level "L"). On the other hand, one of the signal leads m1 through m8 is selected through a multiplexer 42 to be connected to the output terminal TX and input terminal RX of a central processing unit (CPU) 43. To this CPU 43, a voltage of 5 volts is applied from the power source for the connector 33 through a constant 5 volt regulating circuit 44. In connection with this regulating circuit is provided a warning device (not shown) designed to generate a warning when an abnormal voltage of 10 volts or less exists from the connector 33 for a time interval of three seconds or longer. It is arranged that a variety of data are fed to be displayed on a display panel 32 through a display interface 45. Also, the electric signals as generated from a keyboard 46 including the ten key mat 32a or similar are fed into the CPU 43 after having been converted through an input/output encoder 47. In addition, a program EPROM 48 is provided in which the control program for the CPU 43 is stored, and also a buzzer 49.

Figures 7, 8:
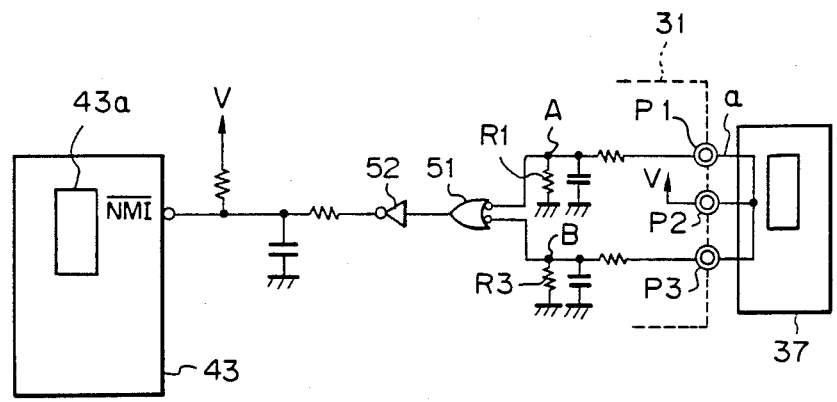
FIG. 7 is a circuit diagram of a circuit for detecting by way of hardware a loose fitting condition of an ROM pack removably attached to the testing apparatus according to one embodiment of the invention.
FIG. 8 is a schematic diagram showing the stored contents of a memory for detecting by way of software a loose fitting state of a ROM pack according to another embodiment of the invention.

FIG. 7 shows a specific circuit for trouble-checking whether a ROM pack 37 which is removably mounted in the trouble-diagnosable multifunction testing apparatus according to the invention is securely in place against the connector pins. In FIG. 7, the ROM pack 37 is shown in a properly mounted position on the testing apparatus 31. The connector pins P1, P2, P3 are connected via a common line a. In this position, a logic signal of H level is applied from a source V to the pin P2 provided on the testing apparatus 31 and the pin P1 provided on the testing apparatus 31 is grounded through a resistor R1, the pin P3 similarly being grounded through a resistor R3. The voltages at the points A and B of the resistors R1 and R3 are respectively supplied to an exclusive OR circuit 51. The output from the exclusive OR circuit 51 is inverted by an inverter 52 to be fed to an interrupt terminal $\overline{NMI}$ of CPU 43.

Next, the operation of the circuit constructed as noted above will be explained. Referring firstly to the case where a ROM pack 37 is mounted in the recess or open space 38, there is a state of connection as shown in the circuit diagram of FIG. 7. In this case, a voltage V is applied to the points A and B of the resistor R1 and R3 through the connector pin P2, the line a and the connector pins P1 and P3, respectively. As the current logic levels at the points A and B reach an H level, their outputs would turn to an L level. As a consequence, the H level signal is fed to the terminal $\overline{NMI}$ after being inverted by the inverter 52, and accordingly no interrupt is then allowed into the CPU 43.

Incidentally, should the pin P1 of the ROM pack 37 have come out of engagement with the testing apparatus, the output from the exclusive OR circuit 51 would then change to an H level, which could make the output from the inverter 52 at an L level, which could consequently allow an interrupt to the CPU 43, thus making it possible to recognize the loose state of that pin of the ROM pack 37.

While FIG. 7 shows an instance in which the fitting state of a ROM pack is checked by way of hardware, it is of course feasible in practice for its current fitting state to be checked by way of software. More specifically, it may be arranged in such a manner that cross-patterned random numbers "55, AA, 66, 99 . . . " are stored in advance in a leading address of a memory 37a in the ROM pack 37, and also stored are cross-patterned random numbers "55, AA, 66, 99 . . . " in the corresponding leading address of a memory 43a in CPU 43, respectively. Then, whenever the ROM pack 37 is accessed for data, data stored in these leading addresses of the memories 43a and 37a will be compared with each other. Should a lack of correspondence be found in these data, it would be recognized that a pin of the ROM pack 37 is in a loose fitting condition.

Figure 9:
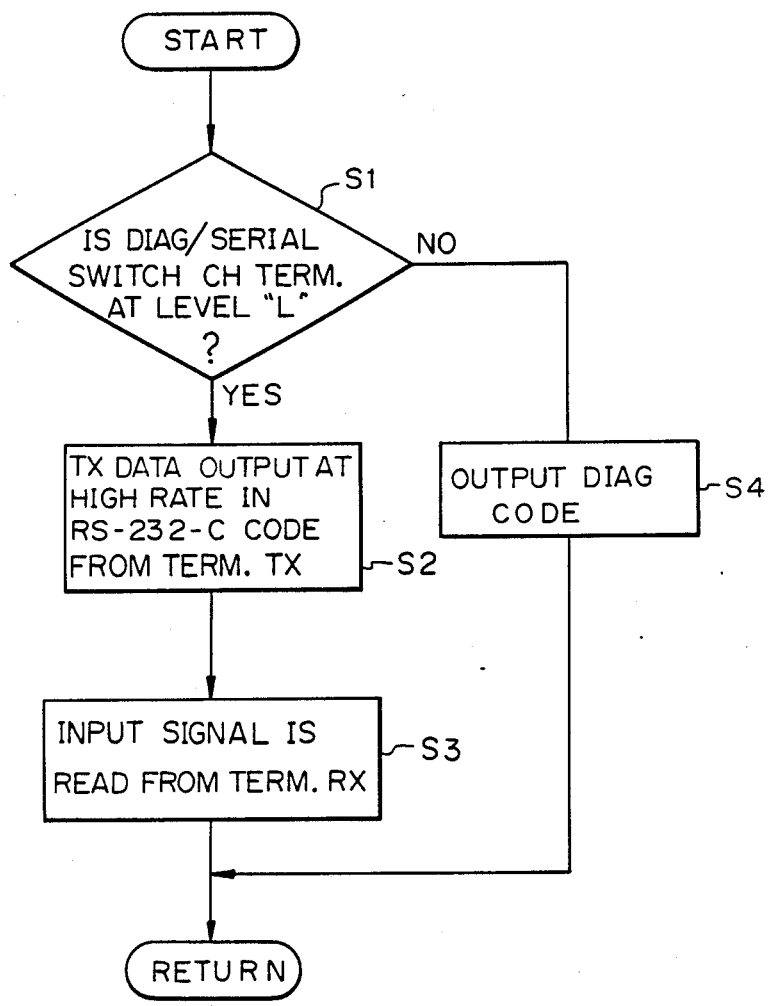
FIG. 9 is a flow chart showing the operating state of the testing apparatus of the invention when it is connected to a lead connector provided in a vehicle.

Reference is now made to the operation of the arrangement noted above in the preferred embodiment of the invention. When performing a check-up on a certain desired part of the vehicle by using the trouble-diagnosable multifunction testing apparatus of the invention, the second half of connector 41b is first connected to the first half of connector 41a in the vehicle. Upon connection, the common signal lead C has the ground potential (logic level "L") applied to it, and all of the switching terminals CH of ECU1 through ECU8 will then be supplied with the signal of logic level "L". At this moment, a processing sequence will be started following the steps or blocks shown in the flow chart of FIG. 9. Firstly, the logic level at the terminal CH is determined to be at the level of "L" (Step 1), and when the second half of connector 41b is duly connected to the first half of connector 41a, there will be a variety of data outputs in 8-bit RS-232C code at a high rate from the terminals TX's of ECU1 through ECU8 as specified in advance by the testing apparatus 31 (Step S2). At the same time, reading of input signals is started from the input terminals RX of ECU1 through ECU8 (Step S3). According to the half-duplex communication system employed in the data transmission between ECU1 through ECU8 and the testing apparatus 31 by way of the signal lines 11 through 18, data transfer from ECU1 through ECU8 to the testing apparatus 31 will take place by turns.

In contrast, when the second half of connector 41b is not connected to the first half of connector 41a, as the current logic level of the switching terminal CH is at the level of "H", as shown in FIG. 6, there is still a low rate signal DIAG being output from the output terminal TX (Step S4). More specifically, in a condition wherein the second half of connector 41b is not connected to the first half of connector 41a, as is a low rate signal DIAG continuously output from each of the output terminals TX of ECU1 through ECU8, the output signal DIAG can be recognized at the conventional tester by connecting it to the first half of connector 41a.

If a mode is set, for instance, such that the current pulse signal from ECU8 is converted into a buzz every time that the level of a pulse as generated from ECU8 changes from L to H or vice versa, for instance, when the vehicle's door is locked, the buzzer may be caused to produce a buzz as desired.

Figure 10:
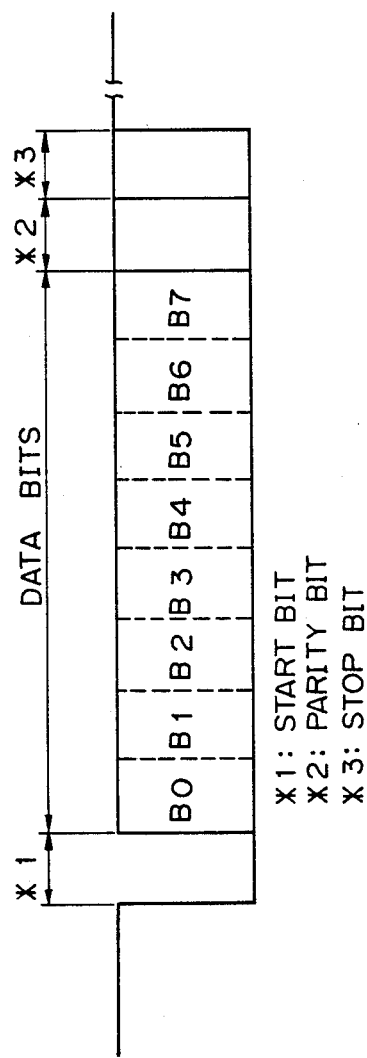
FIG. 10 is schematic diagram showing the format of RS-232C code for outputting data from electronic control units (ECU's) installed in a vehicle.
Figure 11:
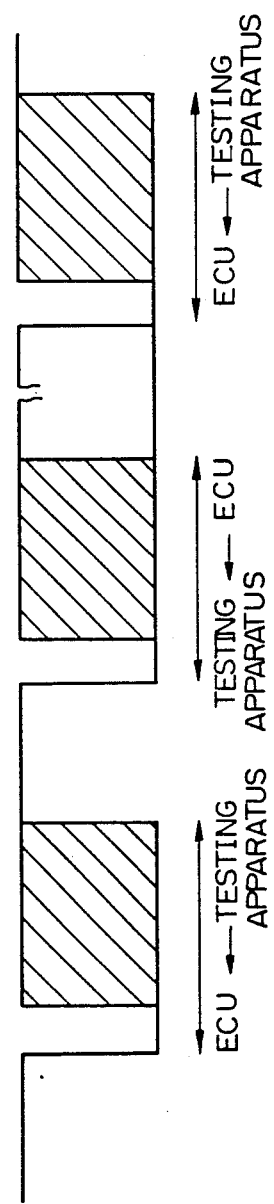
FIG. 11 is a flow chart showing the state of data transfer between the testing apparatus of the invention and ECU's in a vehicle.

Bit B7 of a specific code shown in FIG. 10 to be sent from the testing apparatus 31 of the invention to ECU1 through ECU8 is set to be "1" when it is desired to drive an actuator provided in any of ECU1 through ECU8. On the other hand, when bit B7 is set to be "0", it is shown that this is a transfer of Data from a RAM. Bits B0 through B6 in the code shown in FIG. 10 are for specifying a desired address of a RAM in each of ECU1 through ECU8 as RAM data.

Figure 12B:
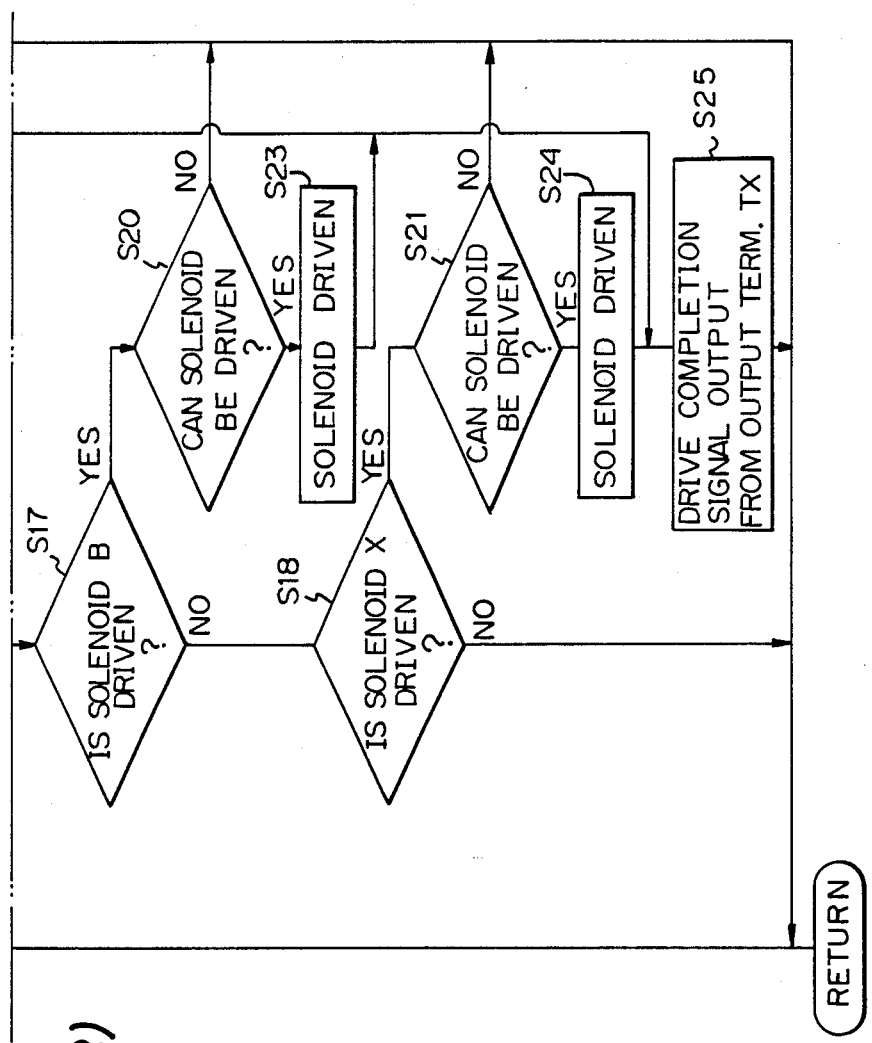
Figure 13:
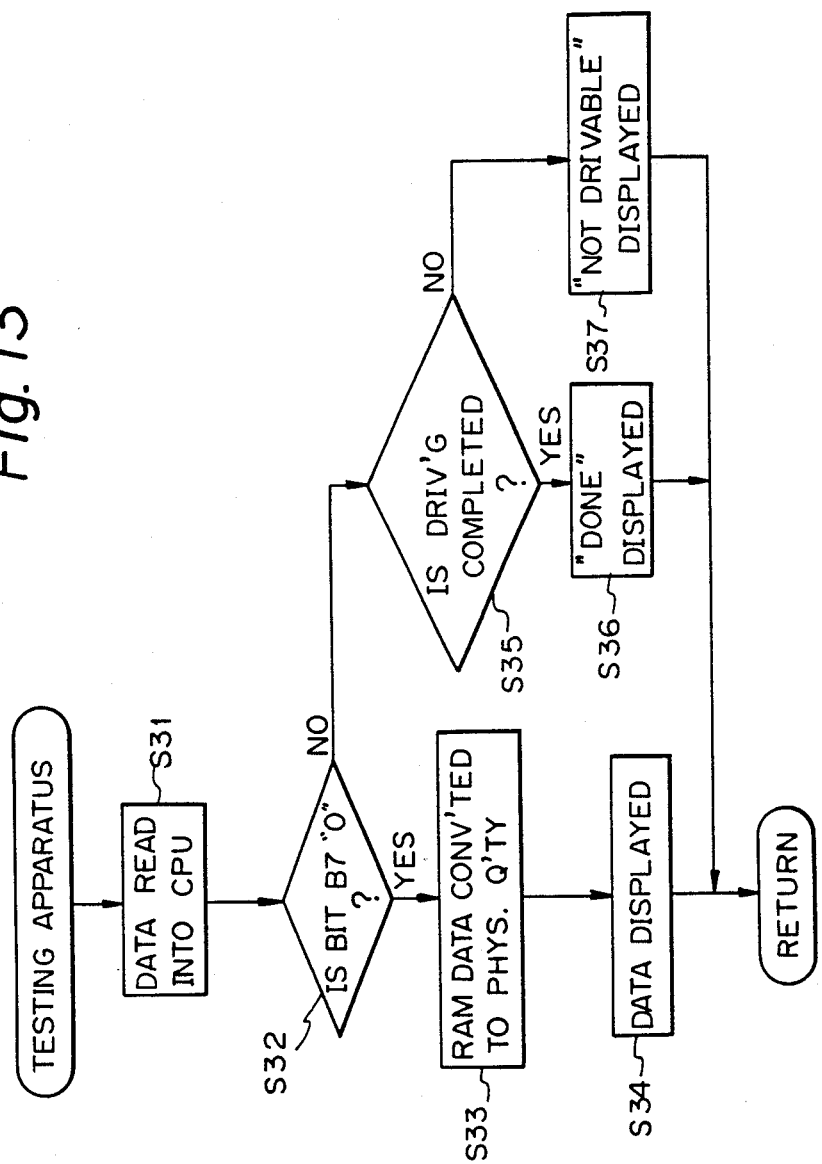
FIG. 13 is a flow chart showing data processing in connection with data transmission in the testing apparatus.

The following will explain the data transmission and receiving processing conducted by the testing apparatus 31 and ECU1 through ECU8, with reference to FIGS. 12 and 13, respectively.

Firstly, the receiving process of ECU1 through ECU8 will be explained. Data will first be read into the input terminal RX of an ECU (Step S11). Then a decision is made as to whether or not bit B7 is "0" (Step S12). If bit B7 is "0", it may be determined that the RAM data of the ECU needs to be output. In this case, any of ECU1 through ECU8 may read required data from its own RAM and accordingly output that RAM data from its own output terminal TX (Steps S13 and S14).

When bit B7 is "1", the driving of an actuator by a specified one among ECU1 through ECU8 (not shown) will be effected for the purpose of controlling, for instance, the engine's throttle valve (Step S15). At the same time, determination is made as to whether or not a specific one of the solenoids A through X for driving the corresponding actuator is required to be driven (Steps S16 through S18). If the driving of any of the solenoids A through X is desired, determination is made as to whether the specific solenoid may be driven (Steps S19 through S21), and if it can be driven, a corresponding solenoid among ones A through X is driven (Steps S22 through S24). During the steps S22 through S24, when the driving of the specified solenoid is completed, a drive completion signal is output from the output terminal TX of that ECU (Step S25). In this manner, there determination is appropriately made by specifying bit B7 either for reading RAM data from the specified ECU or for driving the actuator of the specified ECU.

On the other hand, the reading of specific data is conducted by the testing apparatus 31 once that data has been output from the output terminal TX of a specific ECU. Reference is now made to FIG. 13 for an explanation of this processing. Firstly, data at the input terminal RX of a specific ECU is read into CPU 43 (Step S31). Then, it is determined whether or not bit B7 of that data is "0" (Step S32). If it is determined that bit B7 is "0", as the transmitted data are from a RAM, this specific RAM data is converted into a certain physical quantity, for example, "XX Km/h" (Step S33). Upon conversion, that data will be displayed on the visual display 32 (Step S34).

If it is determined that bit B7 of that data is "1", which represents the fact that a specific actuator is designated to be driven, it is determined whether that driving operation has been completed (Step S35). If it has been completed, a message "Done" will then be displayed on the visual display 32 (Step S36). On the other hand, if it has not been completed yet, a message "Not Drivable" will be displayed on the display (Step S37).

Figure 14:
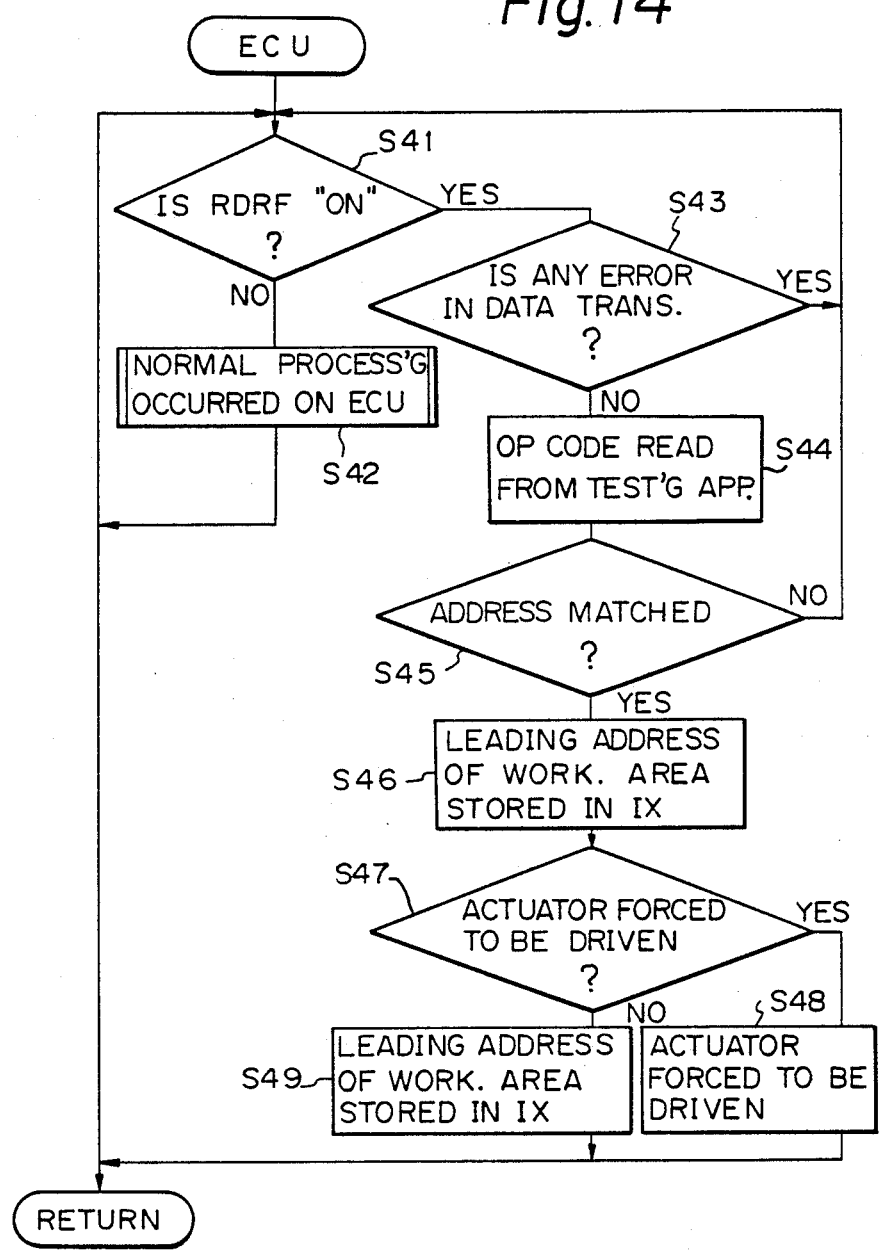
FIG. 14 is a flow chart showing the manner in which data is processed in ECU's in connection with a driving operation of actuators in a vehicle.
Figure 15:
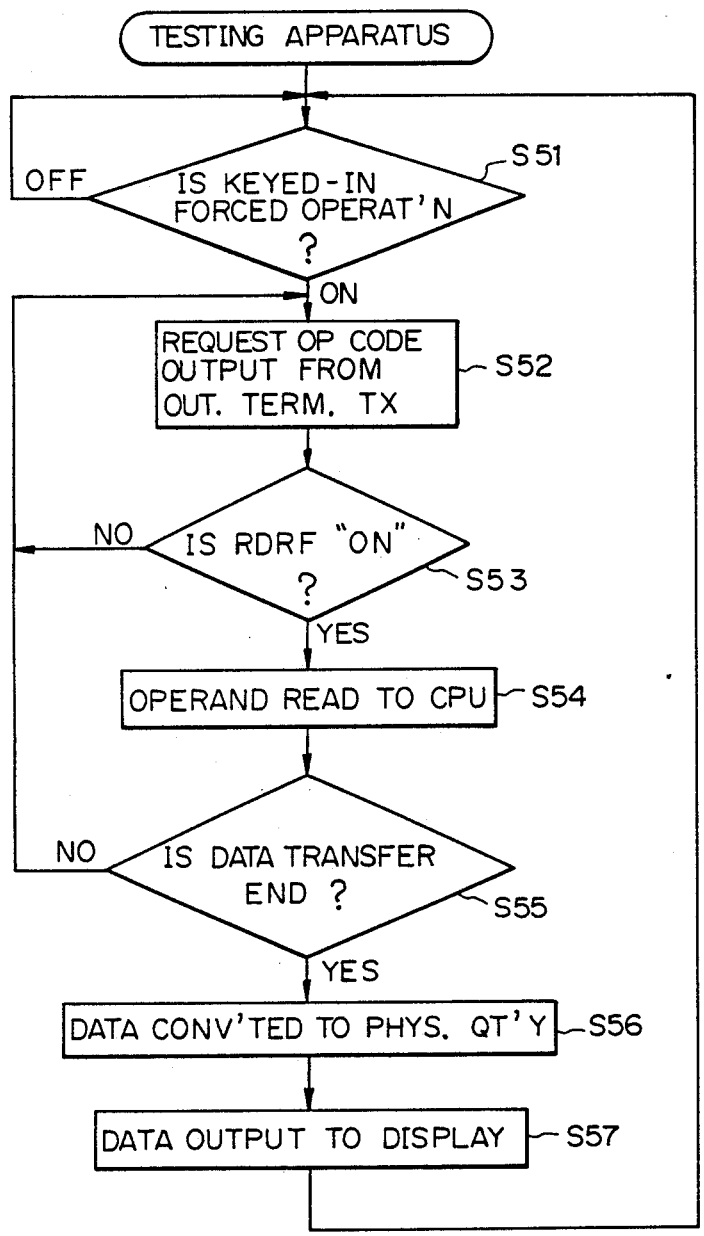
FIG. 15 is a flow chart showing the manner in which data is processed in the testing apparatus of the invention in connection with a driving operation of actuators in a vehicle.

Referring next to FIGS. 14 and 15, the following is an explanation of the processing of an actuator operation from among the processings explained with reference to FIGS. 12 and 13. Firstly, the processing operation of ECU1 through ECU8 will be explained by referring to FIG. 14. In this processing, it is determined if RDRF is on (Step S41), or whether there is any interrupt action from the testing apparatus 31. If no interrupt action exists, the normal processing or an automatic cruising operation is effected by the relevant ECU (Step S42).

In Step S41 noted above, if it is determined that there is an interrupt action, it is next determined whether or not there is any error in data transfer (Step S43), and if there is no error, the Data's operand delivered from the testing apparatus 31 is then read in (Step S44). If stored data are addressed (Step S45) and then the addressing is exactly executed, the leading address of a working area in the ECU is then stored in a resistor IX (Step S46). Next, it is determined whether there is a demand for driving an actuator, or whether or not bit B7 of the current code is "1" (Step S47), and if affirmative, the actuator will accordingly be driven (Step S48). If not, the leading address of the working area stored in the register IX is then output (Step S49).

Referring next to FIG. 15, the processing undertaken by the testing apparatus 31 for an operation of an actuator will now be explained. If an operation of an actuator is firstly specified through a key-in operation, a due operation code according to the specified operation of the actuator will be supplied from an output terminal TX (Steps S51 and S52). After the processing shown in FIG. 14 has been done in accordance with that operation code and relevant data is returned to the testing apparatus 31, an interrupt action takes place, and an operand of that data is then read into CPU43 (Steps S53 and S54). Then, the data reading is continued till the end of transferred data is detected, and upon the detection of this end of the data, that data will be converted into a corresponding physical quantity (Step S56) and will then be fed to the visual display 22 (Step S57).

Figure 16B:
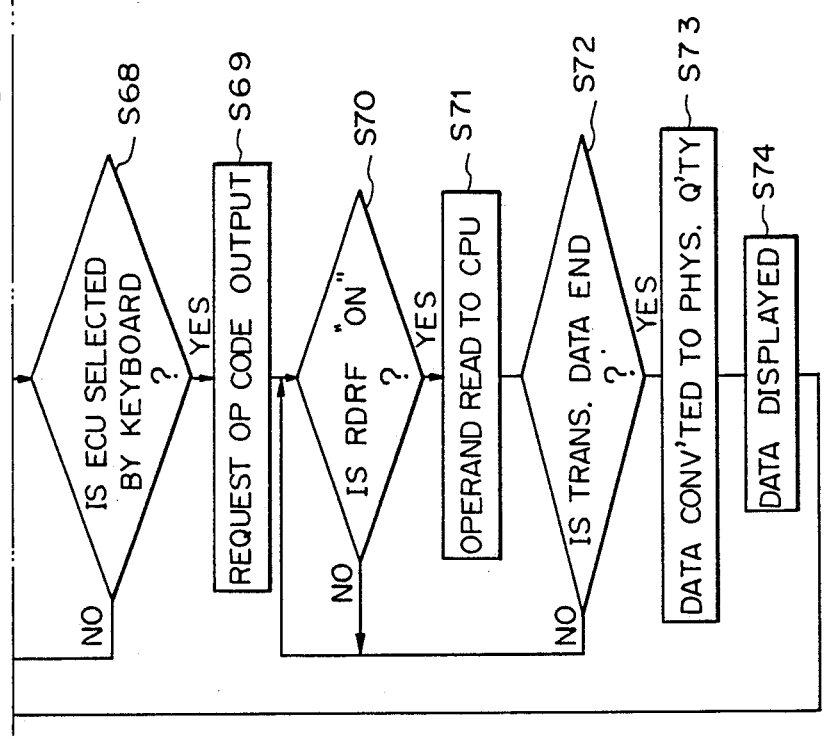

Next, referring to FIG. 16, the setting of a transfer rate will now be explained. When a desired one of ECU1 through ECU8 is selected through a key-in, the multiplexer 42 will shift to the signal lead to the selected ECU so that a relevant transfer rate is set correspondingly in that ECU (Steps S61 through S67). Then, data is delivered or an appropriate operation code for this specific ECU as selected through a following key-in will be generated (Steps S68 and S69). This data is then output to the ECU selected, and if an interrupt action exists as a result of the data from that ECU, an operand will be read into CPU43 (Steps S70 and S71). This data reading is continued till the end of that data transfer, and upon completion of this data reading, that data is then converted into a corresponding physical quantity and is displayed on the visual display 22 (Steps S72 through S74).

In this manner, when either one of ECU1 through ECU8 is selected, an appropriate data transfer rate is set for that specific ECU and, consequently, an appropriate data transfer will in effect be attainable with a proper matching between the testing apparatus 31 and ECU1 through ECU8.

Figure 17:
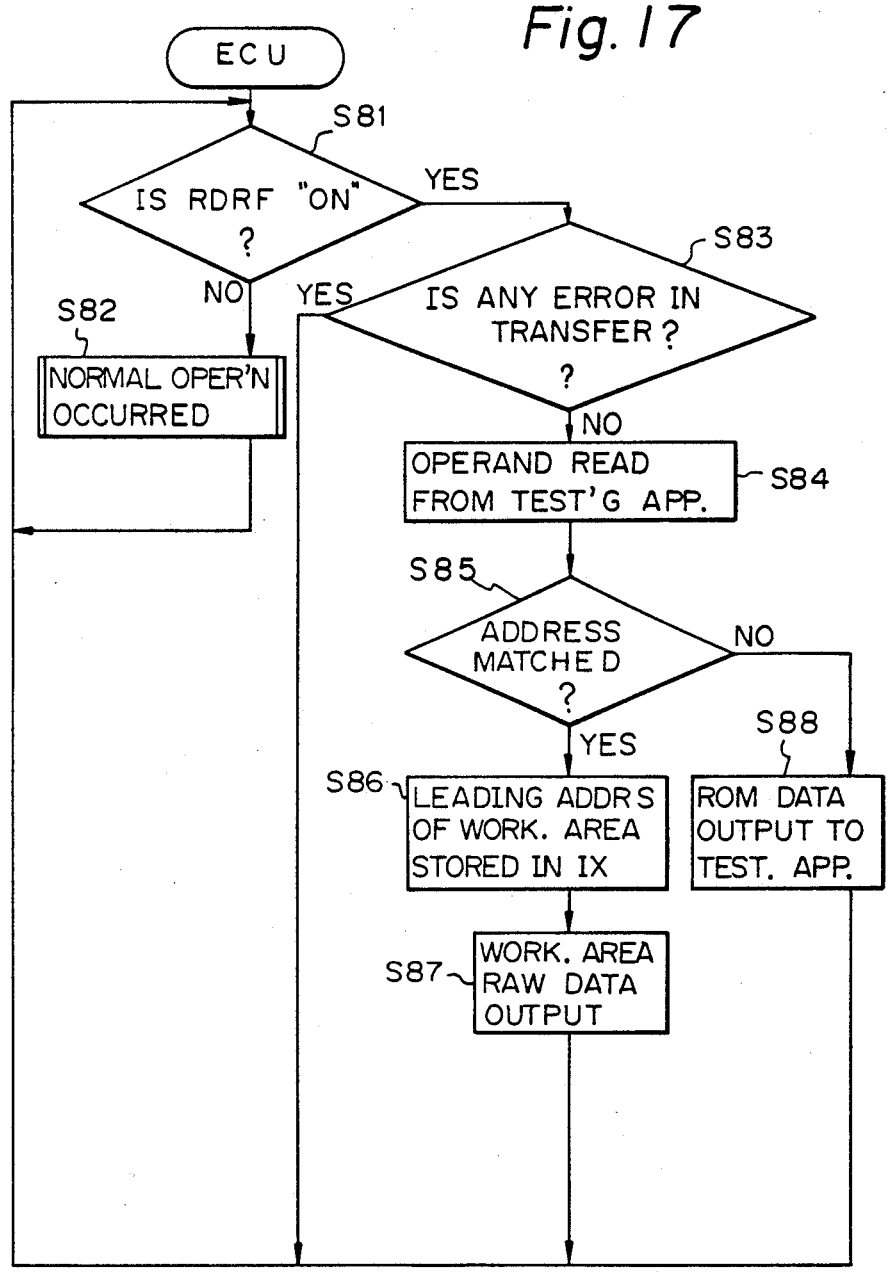
FIG. 17 is a flow chart showing the manner in which data is processed in ECU's for detecting a possible misconnection between the testing apparatus and a ROM pack.

Referring next to FIG. 17, an explanation will be given of the process of detecting whether a ROM pack 37 installed in the testing apparatus 31 is a proper one for an ECU of a particular vehicle's manufacturer and model. There are appropriate settings of data including corresponding manufacturer and model codes as specified in the ECU's in bits B5 through B7 of data to be sent from the testing apparatus 31, and of required items for test in bits B0 through B4, respectively. For example, when bits B0 through B4 are "0001", this means an ignition signal. Referring to FIG. 17, it is determined whether RDRF is "ON", that is, whether or not there is an interrupt action from the testing apparatus 31 (Step S81). When no interrupt is required, the normal operation of an ECU will take place, for example, an automatic cruising operation (Step S82).

In Step S81 above, if it is determined that an interrupt is required, it is next determined if any error exists in data transfer (Step S83). If not, an operand delivered from the testing apparatus 31 will be read in properly (Step S84). It is then determined if there is correspondence between the addresses involved (Step S85), and if so, the leading address of a working area of an ECU will be stored in the registor IX (Step S86), and the leading address contents of the working area stored in the resistor IX will then be generated in the testing apparatus 31 (Step S87). If a negative decision "NO" is made in Step S85, an output meaning "ROM pack error" is supplied to the testing apparatus 31 (Step S88). This data will then be transferred to the visual display 32 where "ROM pack error" is accordingly indicated.

Figure 18:
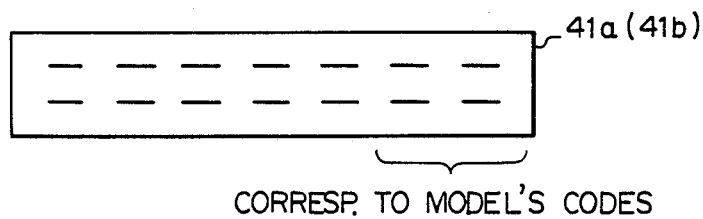
FIG. 18 is a schematic view generally showing a collective lead connector.
Figure 19:
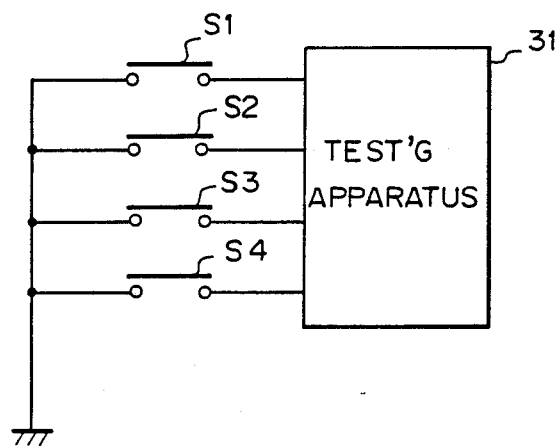
FIG. 19 is a schematic diagram showing a means for setting data including car manufacturer and model codes.

While it was explained with reference to FIG. 17 that a "ROM pack error" is detected through the processing undertaken by ECU's, it is of course possible in practice that data for a specific manufacturer or model is to be specified by a certain ECU by giving a 4-bit signal through four additional pins provided in both connectors 41a and 41b, as schematically shown in FIG. 18. In this arrangement, a four-bit signal ma in practice be set in the testing apparatus 31 by using switches S1 through S4 provided externally, as shown in FIG. 19.

Figure 20:
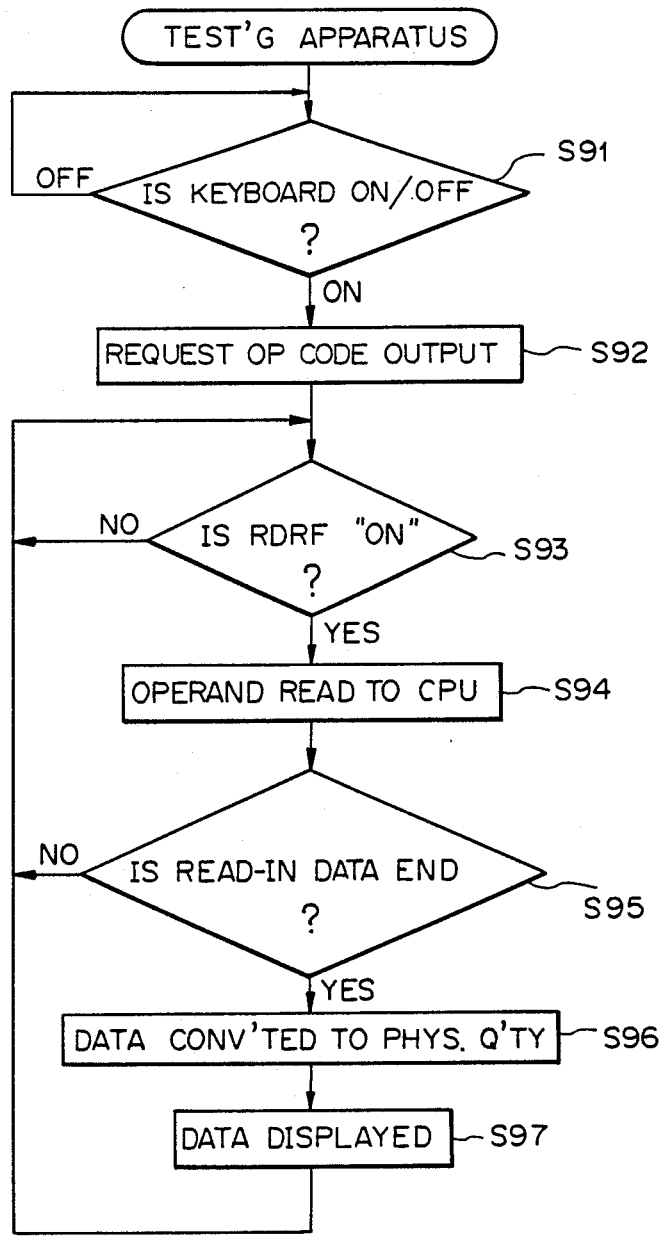
FIG. 20 is a flow chart showing the manner in which data is processed in the testing apparatus in connection with the clearance of diagnosis data in ECU's.
Figure 21:
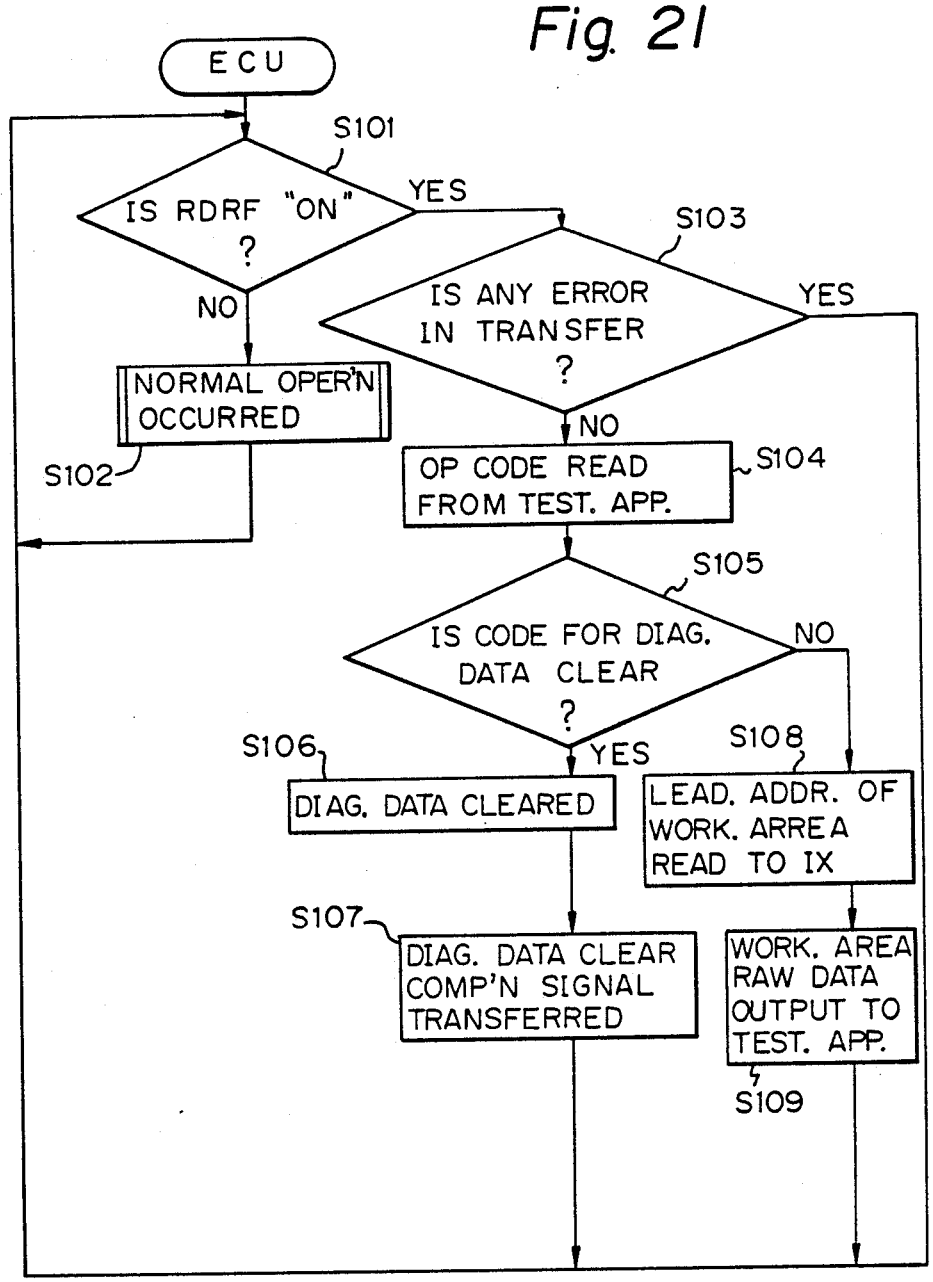
FIG. 21 is a flow chart showing the manner in which data is processed in ECU's in connection with the clearance of diagnosis data in ECU's.

Next referring to FIGS. 20 and 21, the process of clearing the diagnosis data stored in ECU1 through ECU8 will now be explained. This process of clearing the diagnosis data will be conducted particularly when a failure has been detected through certain diagnosis data, and then the failure is repaired. As the diagnosis data should not be cleared with a ready key operation, it is preferably arranged in such a manner that the "DIAG" key 32g has to be operated three times, and then "99" is keyed through the ten keys, giving the operation code for a clear demand from the output terminal TX (Steps S91 and S92). After the processing shown in FIG. 21 has been done according to a specific operation code, and upon the return of data to the testing apparatus 31, an interrupt action occurs, and then an appropriate operand of that data will be read into CPU43 (Steps S93 and S94). Read-in of data is continued till the end of transferred data is detected in Step S95, and upon detection of the transfer data's end, that data is converted into a corresponding physical quantity (Step S96), and then will be output to the visual display 22 (Step S97).

Next, the processing conducted by ECU's will be explained. Referring to FIG. 21, it is determined whether RDRF is "ON", or whether an interrupt action from the testing apparatus 31 exists (Step S101). If no interrupt is required, the normal operation of the ECU, for example, an automatic cruising operation, will then take place (Step S102).

In Step S101 above, if it is determined that an interrupt is required, it is determined whether there is an error in data transfer (Step S103), and if there is no error, the operand of data delivered from the testing apparatus 31 is read in (Step S104). It is then determined whether or not this operand is a code for clearing the diagnosis data (Step S105), and if the decision is an affirmative "YES" (Step S105), the diagnosis data is cleared (Step S106). Then data which shows the completion of clear operation of the diagnosis data is transferred from the output terminal TX of an ECU (Step S107).

In Step S105 noted above, if the result is a negative decision "NO", the leading address of a corresponding working area is read into the register IX (Step S108), and data of the working area specified will then be supplied to the testing apparatus 31. In this manner, the diagnosis data in relation to ECU1 through ECU8 will be cleared.

Figure 22A:
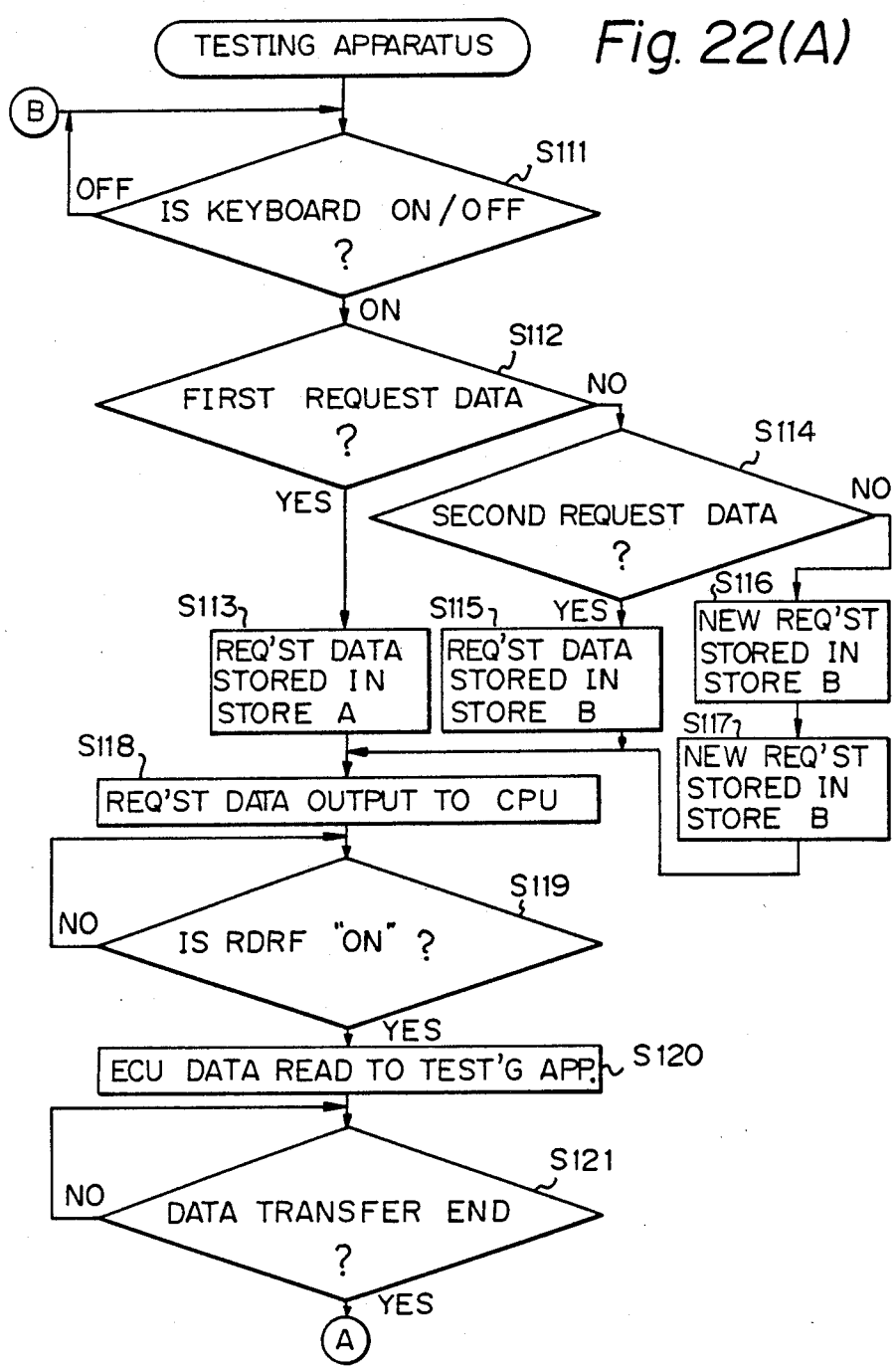
FIGS. 22(A) and 22(B) are flow charts showing the manner in which data is processed in connection with multiplexing relating to display of required data.
Figure 22B:
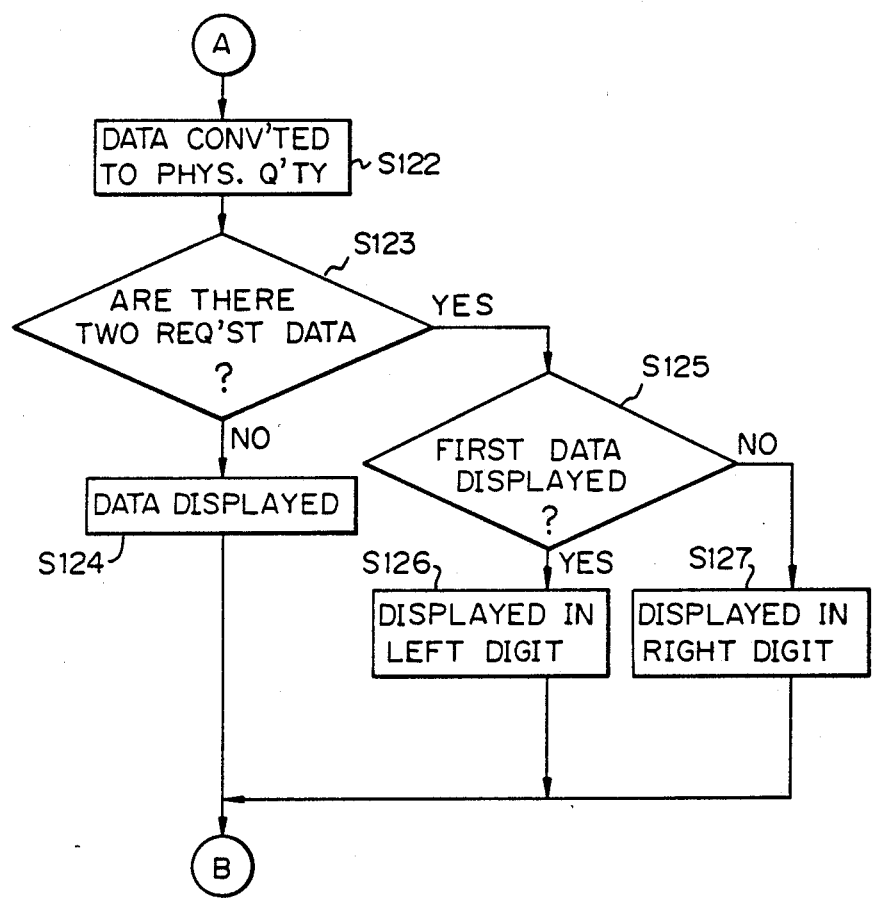

FIGS. 22(A) and 22(B) illustrate a case where a plurality of data, for example, data on a current throttle opening and on a current rotational speed of a vehicle's engine, delivered from any of ECU1 through ECU8 are displayed on the visual display 32. In a case where a demand is made through a key-in operation for certain data from an ECU, the data obtained from the ECU will then be written into a storage area A (Step S11 through S113). When second data arrives at the testing apparatus 31, that request data is stored in a storage area B (Steps S114 and S115). When third data is required at an ECU, the contents of the storage area B are then transferred to the storage area A, and newly requested data is stored in the storage area B (Steps S116 and S117). The requested data stored in the storage areas A and B will then be supplied to the relevant ECU (Step S118).

If data area returned from ECU's in response to a demand from the testing apparatus 31, an interrupt action is effected in the testing apparatus 31 (Step S119). and the data delivered from the ECU's will then be read into the testing apparatus 31 (Step S120). This process of reading data is continued till the end of data transfer, and upon the completion of data transfer, it is determined whether an affirmative decision "YES" is given in Step S121, and the process then proceeds to Step S122 and the following steps.

Then, in Step S123, it is determined whether there are two request data, and if the decision is "NO", or if there is only one request data, that transferred data will be fed to the visual display 32 to be displayed thereon (Step S124). On the other hand, if there are two request data. the first data will be displayed on the visual display 32 in the left-hand digits thereof, and the second data will be displayed in the right-hand digits, respectively (Steps S125 through S127).

While the invention has been described by way of a specific embodiment thereof, it is to be understood, as will be apparent to those skilled in the art, that the invention may be embodied in various ways without being restricted to this specific embodiment, and that many other variations and modifications may be made without departing from the spirit and scope of the invention as defined in the appended claims.

It is also to be understood that the appended claims are intended to cover all of such generic and specific variations particular to the invention as disclosed herein and all statements relating to the scope of the invention which as a matter of language might be said to fall thereunder.

What is claimed is:

1. Vehicle diagnostic testing apparatus for operating with a conventional test unit that receives data in a first format and with a diagnostic test unit that receives data in a second format which is different from said first format, said diagnostic testing apparatus comprising:
   a plurality of electronic control units, each of said electronic control units being responsive to one or more vehicle operating conditions for generating diagnostic data signals, said electronic control units generating said diagnostic data signals in said first format and being responsive to a control signal for generating said diagnostic data signals in said second format;
   means for connecting said conventional test unit to each of said plurality of electronic control units;
   means responsive to said diagnostic data signals for transmitting said diagnostic data signals from each of said plurality of electronic control units to said conventional test unit in said first format to allow said conventional test unit to operate with said diagnostic testing apparatus;
a diagnostic test unit attachable to each of said plurality of electronic control units;
means in said diagnostic test unit for generating said first control signal; and
means for transmitting said control signal from said diagnostic test unit to each of said electronic control units to enable said electronic control units to transfer said diagnostic data signals to said diagnostic test unit in said second format.

2. Vehicle diagnostic testing apparatus according to claim 1 wherein said diagnostic data signals in said first format are transmitted at a first data transfer rate and said diagnostic data signals in said second format are transmitted at a second data transfer rate.

3. Vehicle diagnostic testing apparatus according to claim 2 wherein said second data transfer rate is higher than said first data transfer rate.

4. Vehicle diagnostic testing apparatus for operating with conventional testing apparatus and with a high-speed diagnostic unit, said diagnostic testing apparatus comprising:
a plurality of electronic control units, each of said electronic control units being responsive to one or more vehicle operating conditions for generating diagnostic data signals, said electronic control units generating said diagnostic data signals at a first data transfer rate and being responsive to a control signal for generating said diagnostic data signals at a second data transfer rate which is higher than said first data transfer rate;
a connector having a plurality of pins, each of said pins being connected to at least one of said plurality of electronic control units;
means responsive to said diagnostic data signals for transmitting said diagnostic data signals from said electronic control units to said connector at said first data transfer rate to allow said conventional testing equipment attached to said connector to operate with said testing apparatus;
a high-speed diagnostic test unit attachable to said connector;
means in said diagnostic test unit for generating said first control signal when said diagnostic test unit is attached to said connector; and
means for transmitting said control signal from said high-speed diagnostic test unit to each of said electronic control units to enable said electronic control units to transfer said diagnostic data signals to said high-speed diagnostic test unit at said second data transfer rate.

5. Vehicle diagnostic testing apparatus according to claim 4 wherein said control signal transmitting means comprises a signal line connected in parallel to each of said plurality of electronic control units.

6. Vehicle diagnostic testing apparatus according to claim 5 wherein said signal line is connected to one of said plurality of pins in said connector so that said control signal is generated in said high-speed diagnostic test unit and passes through said connector to said plurality of electronic control units.

7. Vehicle diagnostic testing apparatus according to claim 6 wherein said high-speed diagnostic test unit comprises a processing unit and a multiplexer for selectively connecting predetermined ones of said plurality of connector pins to said processing unit so that said processing unit can receive diagnostic data signals from said plurality of electronic control units.

8. Vehicle testing apparatus according to claim 4 further comprising a plurality of actuators for operating vehicle systems and wherein each of said plurality of electronic control units comprises memory means for storing said diagnostic data signals and means for operating predetermined ones of said plurality of actuators and wherein said high-speed diagnostic test unit comprises:
means for generating a second control signal;
means for transmitting said second control signal to said electronic control units to cause said electronic control units to operate predetermined ones of said plurality of actuators;
means for generating a third control signal; and
means for transmitting said third control signal to said electronic control units to cause said electronic control units to transfer information stored in said memory means to said high-speed diagnostic test unit.

9. Vehicle diagnostic testing apparatus according to claim 8 wherein each of said plurality of electronic control units comprises means responsive to said second control signal for selecting one of said plurality of actuators and means for operating said selected one of said plurality of actuators.

10. Vehicle diagnostic testing apparatus according to claim 8 wherein said high-speed diagnostic test unit further comprises means for selecting one of said plurality of electronic control units and means for transmitting control data to each of said plurality of electronic control units at a plurality of data transfer rates, said control data transmitting means cooperating with said selecting means so that control data is transmitted from said high-speed diagnostic test unit to said selected one of said plurality of electronic control units at a predetermined one of said plurality of data transfer rates.

11. Vehicle diagnostic testing apparatus according to claim 10 wherein said control data includes manufacturer and model codes and wherein said memory means in said selected one of said electronic control units stores a manufacturer code and a model code specific to said selected electronic control unit and wherein said selected one of said electronic control units further comprises means responsive to said manufacturer code and to said model code in said control data and to said manufacturer code and said model code stored in said memory means for generating an error signal when said manufacturer code and said model code in said control data do not match said manufacturer code and said model code stored in said memory means.

12. Vehicle diagnostic testing apparatus according to claim 4 wherein said high-speed diagnostic test unit further comprises means for generating a clear control signal and wherein each of said plurality of electronic control units further comprises memory means for storing said diagnostic data signals and means responsive to said clear control signal for clearing stored diagnostic data signals from predetermined portions of said memory means.

13. Vehicle diagnostic testing apparatus according to claim 4 wherein said high-speed diagnostic control unit further comprises a detachable ROM pack comprising a read-only memory which contains predetermined data including a manufacturer code and a model code unique to each of said plurality of electronic control units.

14. Vehicle diagnostic testing apparatus according to claim 13 wherein said high-speed diagnostic test unit further comprises a connector for connecting said ROM pack to said diagnostic data unit, means for generating predetermined test signals, means for transmitting said test signals to said ROM pack and means for receiving a connection signal from said ROM pack and wherein said ROM pack comprises means responsive to said test signals for logically combining said test signals to generate said connection signal so that said connection signal will be detected by said high-speed diagnostic test unit when said ROM pack is properly attached thereto and said connection signal will not be detected by said high-speed control unit when said ROM pack is disconnected therefrom or is improperly connected thereto.

15. Vehicle diagnostic testing apparatus according to claim 4 wherein said high-speed diagnostic test unit comprises acoustic alarm means responsive to said diagnostic data signals for generating an audible alarm signal when a change occurs in a selected one of said diagnostic data signals.

* * * * *